United States Patent [19]
Markle

[11] Patent Number: 5,585,972
[45] Date of Patent: Dec. 17, 1996

[54] ARBITRARILY WIDE LENS ARRAY WITH AN IMAGE FIELD TO SPAN THE WIDTH OF A SUBSTRATE

[75] Inventor: David A. Markle, Saratoga, Calif.

[73] Assignee: Ultratech Stepper, Inc., San Jose, Calif.

[21] Appl. No.: 389,035

[22] Filed: Feb. 15, 1995

[51] Int. Cl.$^6$ .................................................. G02B 17/00
[52] U.S. Cl. ........................................................ 359/732
[58] Field of Search .............................. 359/732, 733, 359/736, 727, 726; 355/53, 67

[56] References Cited

U.S. PATENT DOCUMENTS

| | | | |
|---|---|---|---|
| 4,953,960 | 9/1990 | Williamson | 359/663 |
| 5,003,345 | 5/1991 | Markle | 355/53 |
| 5,164,794 | 11/1992 | Markle | 356/394 |
| 5,303,001 | 4/1994 | Jeong | 355/53 |
| 5,393,371 | 2/1995 | Chang | 216/24 |
| 5,402,205 | 3/1995 | Markle | 355/53 |

*Primary Examiner*—Georgia Y. Epps
*Assistant Examiner*—Ricky Mack
*Attorney, Agent, or Firm*—Allston L. Jones

[57] ABSTRACT

A system to transfer a pattern from a reticle to a substrate using a lens array having an arbitrarily wide image field that spans the width of the substrate. The disclosed system incorporates multiple, Wynne Dyson lenses arranged in serial pairs and staggered in position so that each dual serial Wynne Dyson lens system transfers a portion of the overall image from the reticle to the substrate as each are transported past the array of lens pairs. To transfer a complete, unbroken pattern on the substrate, each of the dual serial Wynne Dyson lens pairs are positioned in opposing and side-by-side positions and are staggered with respect to the scan direction. Each lens pair optionally includes individual internal adjustments, so that the pattern produced on the substrate does not contain any breaks or discontinuities.

17 Claims, 6 Drawing Sheets

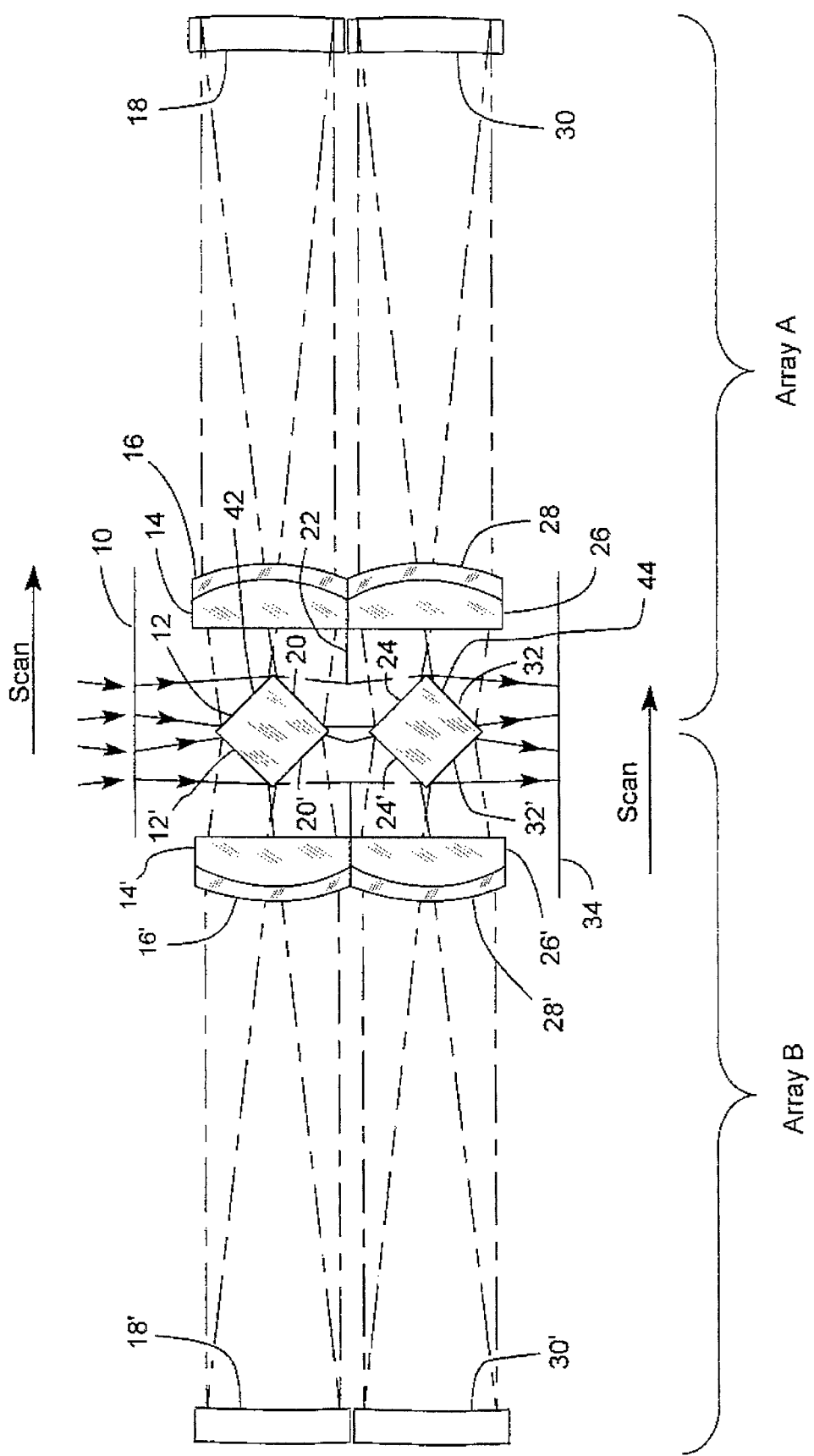

5,585,972

ARBITRARILY WIDE LENS ARRAY WITH AN IMAGE FIELD TO SPAN THE WIDTH OF A SUBSTRATE

FIELD OF THE INVENTION

The present invention relates to a lens system that has a wide image field, namely, an array of lenses that is structured to have a image field that spans the width of a substrate to be patterned.

BACKGROUND OF THE INVENTION

Presently there are many situations where it is necessary to pattern substrates that may be 10 to 12 inches wide. With existing lenses a substrate of that width can only be patterned using a multiplicity of scans. To perform such a task with conventional lenses is difficult and slow since in order to do so multiple scans are required using an accurate stage with two dimensional motion capability.

In some copy machines an array of graded index fibers have been used to image a long thin area. However, in precision lithographic applications performing imagery in this way is hopelessly crude and not viable.

Arrays of tiny lenses that are fabricated as binary optic lenses could be used for this application, but this approach is also impractical in precision applications since these lenses must be very small to limit aberrations thus creating fabrication difficulties that are acute. Additionally, binary optics tend to produce a lot of stray light that also is undesirable in a high resolution optical system.

What is needed is an optical system that combines high resolution and a very large contiguous field size without the lens system being extremely large. The Wynne Dyson array of the present invention provides such a lens system with all of those capabilities without being overly large.

SUMMARY OF THE INVENTION

In accordance with the present invention, a new pattern scanning and projection system to reproduce a pattern from a reticle to a substrate is disclosed. The system of the present invention scans a pattern from a portion of the length of a reticle and projects that scanned pattern onto a corresponding length of a substrate. In that embodiment there is a first carriage to receive and transport the reticle to scan the pattern thereon followed by a pair of Wynne Dyson lens systems in series with each other positioned to receive the scanned pattern as the reticle is transported by the first carriage and to transmit that scanned pattern through the pair of Wynne Dyson lens systems. There is also a second carriage to receive the substrate to provide motion thereto with that motion being provided in synchronization with the transport of the reticle on the first carriage to position the substrate to receive the scanned pattern from the pair of Wynne Dyson lens systems.

The present invention can also take on an expanded form by including multiple Wynne Dyson lens pairs arranged to cover the entire width of the reticle. Each lens pair projects a portion of the pattern across the width of the reticle to a corresponding position on the substrate. The field relayed by each Wynne Dyson pair is trapezoidal shaped and positioned so that after scanning, a portion of each field is overlapped with portions of the neighboring fields and therefore the imagery is continuous across the field.

BRIEF DESCRIPTION OF THE FIGURES

FIG. 2 illustrates the alignment of the useful fields on the substrate of a plurality of aligned dual Wynne Dyson lens systems as in FIG. 1a.

FIG. 3a is a simplified side view of the Wynne Dyson array of the present invention.

DESCRIPTION OF THE PREFERRED EMBODIMENTS

Figure 4:
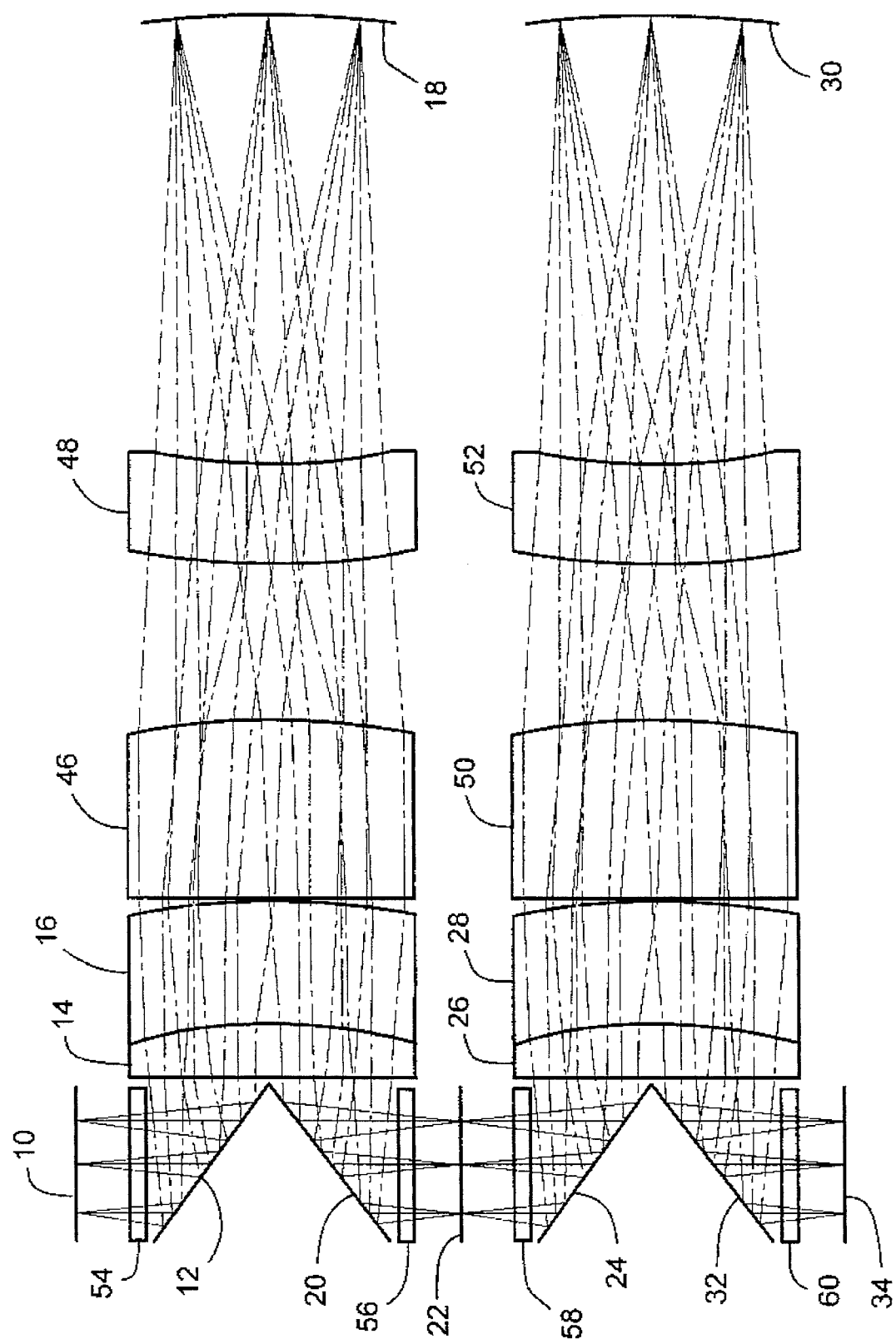
FIG. 4 is a simplified side view of a second dual Wynne Dyson lens system configuration of the present invention.

There has long been a need for a lithography system with a high throughput and low cost that has the capability of patterning large substrates (e.g. multichip modules, flat panels, etc.). The system of the present invention, as described below and shown in FIG. 4, is a 1× optical system that has a field of about 0.75 inches in width and whatever desired length (e.g. 6, 12 or 22 inches) with a separation between focal planes of only about 7.0 inches, thus making it possible to mount the reticle mask and substrate on a common carriage resulting in a single scan in one direction which in turn yields the desired very high throughput of the system.

As will be seen in the following text and accompanying figures, the present invention incorporates a plurality of small dual Wynne Dyson lens systems each employing two Wynne Dyson lenses in series. Then the overall array of the present invention consists of an array of two, or more, Wynne Dyson lens systems to produce a field of the desired width.

Figure 1A:
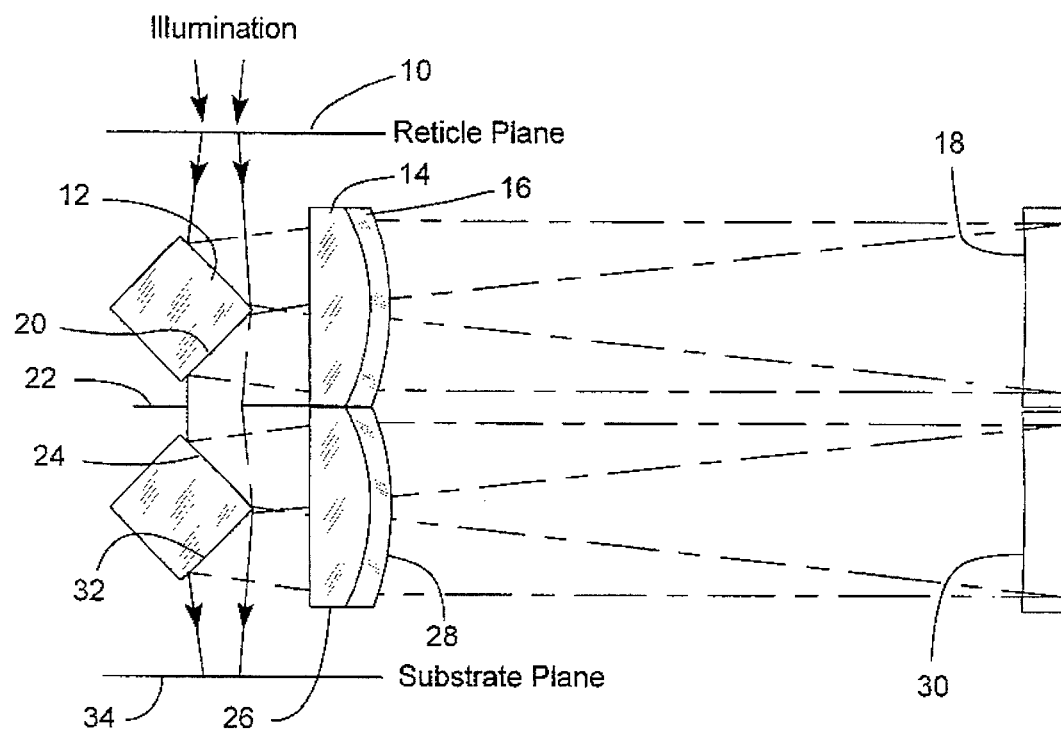
FIG. 1a is a simplified side view of one dual Wynne Dyson lens system of the present invention.

In FIG. 1a there is shown a side view of the basic dual Wynne Dyson lens system of the present invention. In this view it can be seen that the illumination that passes through reticle 10 strikes first fold mirror 12 and is reflected into the top half of first plano lens 14, continues through the top half of first meniscus lens 16 and is spread over substantially the entire surface of first concave mirror 18. First concave mirror 18 in turn reflects the light striking it to the lower half of first meniscus lens 16, then through the lower half of first plano lens 14, and onto second fold mirror 20 from which the light is reflected downward to the aperture in plate 22. This defines the first Wynne Dyson lens which has a magnification of −1.

The second Wynne Dyson lens shown here is the same as the first lens and performs in the same manner. In the second system the light that passes through the aperture in plate 22 is reflected from third fold mirror 24, to the top half of second plano lens 26, proceeds through the top half of second meniscus lens 28 and is then transmitted to substantially the full surface of second concave mirror 30. From the full surface of second concave mirror 30 the light is reflected to the lower half of second meniscus lens 28, progresses through second plano lens 26 to fourth fold mirror 32 from which the light is reflected to substrate 34. Both Wynne Dyson lenses are necessary in the system shown in FIG. 1a if the image on reticle 10 is the image that is to be projected to substrate 34 with the correct orientation for overlapping the image planes.

Figure 1B:
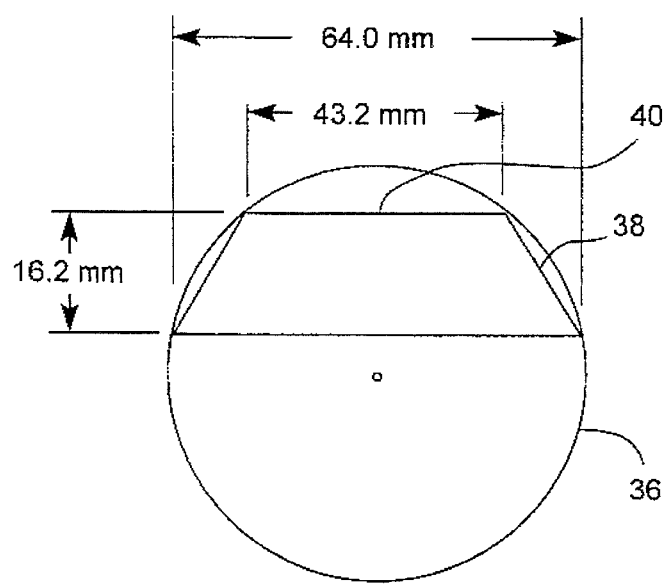
FIG. 1b illustrates the useful field of the Wynne Dyson array of FIG. 1a illustrated relative to the width of the lens array.

FIG. 1b illustrates the useful field of the dual Wynne Dyson lens system of FIG. 1a. Here the full field size of the lens system is illustrated as circular field 36, which for purposes of illustration has a diameter of 64.0 mm. The useful field is illustrated as trapezoid field 38 with the minimum width thereof being the upper trapezoidal field boundary 40 shown here as being 43.2 mm long resulting in a height of the trapezoid of 16.2 mm. To properly orient the illustration of the view of FIG. 1b with that of FIG. 1a, the upper trapezoidal field boundary 40 of trapezoid field 38 is perpendicular to the page and is furthest from second plano lens 26. Additionally, the plane of FIG. 1b is the plane of substrate 34. Another way to describe the view of FIG. 1b is to say that trapezoid field 38 would be the field on substrate 34 projected back to reticle 10 if one were looking down on reticle 10.

Figure 2:
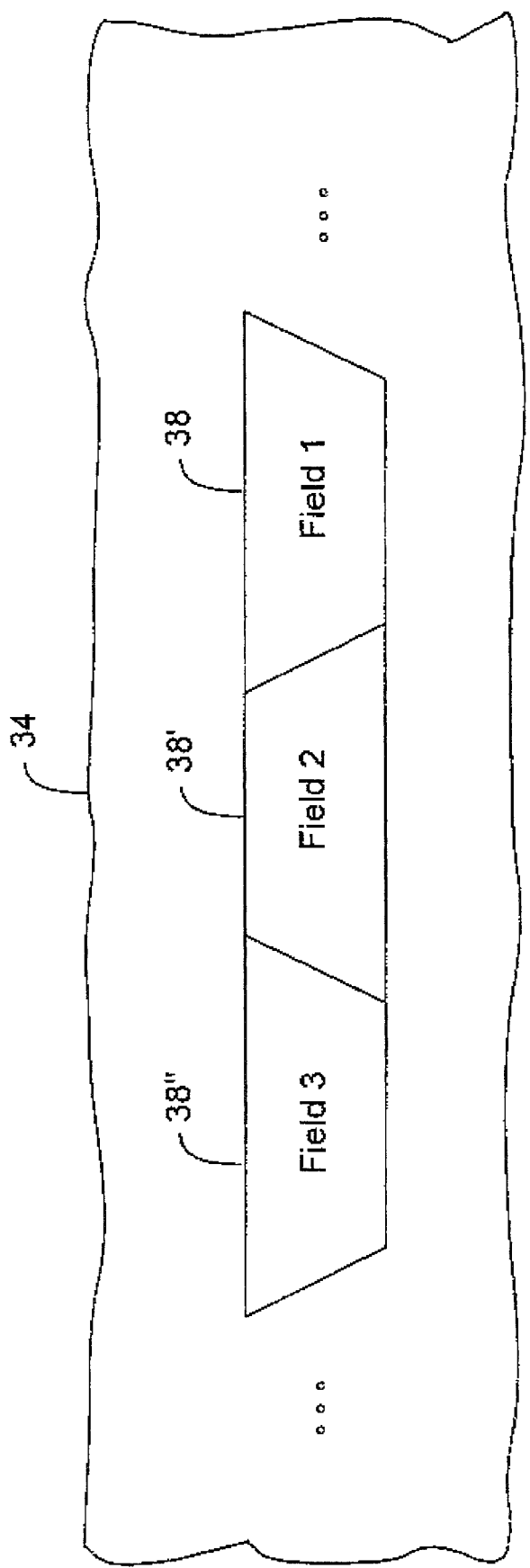

Thus it can be seen that in order to project an image from reticle 10 over an elongated field on substrate 34 in a single pass, multiple trapezoidal fields 38, 38', 38" . . . need to be oriented as illustrated in FIG. 2 as viewed on the surface of substrate 34.

Figure 3B:
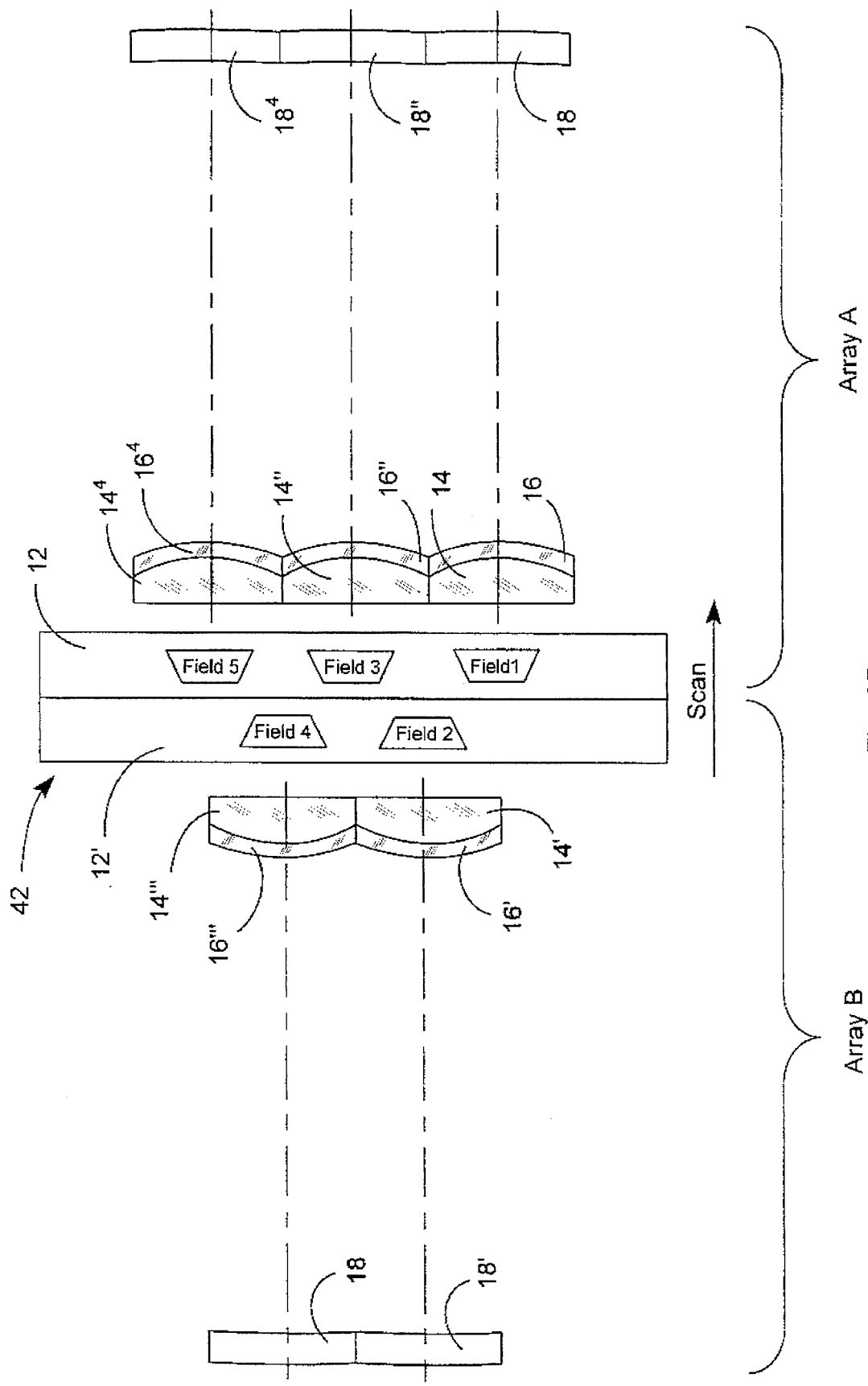
FIG. 3b is a simplified top view of an array of five dual Wynne Dyson lens systems of the present invention.

Referring next to FIGS. 3a and 3b there is shown a simplified view of an array of dual Wynne Dyson lens systems of the present invention that generates the field pattern on substrate 34 as shown in FIG. 2. To facilitate the recognition of the various dual Wynne Dyson lens systems of the present invention, the component reference numbers have been retained for each additional lens system with a superscript added to those numbers. Additionally to facilitate discussion of the operation of the overall array of the present invention, the right side has been labelled "Array A" and the left side has been labelled "Array B". In both FIGS. 3a and 3b the direction of scan of both reticle 10 and substrate 34 is illustrated as from left to right. The scan direction could alternately be from right to left.

Thus, in FIG. 3a a side view of an array of the dual Wynne Dyson lens systems is illustrated with the second Wynne Dyson lens system shown as a portion of Array B and from FIG. 3b it can further be seen that the second dual Wynne Dyson lens system is staggered with respect to the first such lens system, thus the visible side of the second lens system on the left in FIG. 3a is not in the same plane as the first lens system. From FIG. 3b it can also be seen that upper fold mirror prism 42 is a long rectangular prism that runs the full length of the complete array between first plano lenses 14, 14', 14", 14''' and 14⁴ with first fold mirror 12 being shared by each of the lens systems that make up Array A, and fold mirror 12' being shared by each of the lens systems in Array B. Note, lower fold mirror prism 44 also runs the full width of the overall array and has the same characteristics as upper fold mirror prism.

Further, in FIG. 3b it can be seen that one edge of plano lens 14' is substantially aligned with the centerline of plano lens 14, one edge of each of plano lenses 14 and 14" are substantially aligned with the centerline of plano lens 14', the second edge of plano lens 14' and one edge of plano lens 14''' are substantially aligned with the centerline of plano lens 14", and so on. It naturally follows then that these lens systems could be cascaded indefinitely following this pattern.

FIG. 4 illustrates a second stacked dual Wynne Dyson five lens element system of the present invention that has a higher numerical aperture than the lens system of FIG. 1a and provides more resolution than the first lens system of FIGS. 3a and 3b. As with the first lens system, illumination is received at the top and passes through reticle 10, strikes first fold mirror 12 and is reflected into the top half of first plano lens 14, and continues through the top half of first meniscus lens 16. At this point two additional lens have been added, a first biconvex lens 46 followed by a third meniscus lens 48 with the illumination continuing through the top half of each of those lenses and from third meniscus lens 48 the illumination is spread over substantially the entire surface of first concave mirror 18. First concave mirror 18 in turn reflects the light striking it to the lower half of third meniscus lens 48, to the lower half of first biconvex lens 46, to the lower half of first meniscus lens 16, then through the lower half of plano lens 14, and onto second fold mirror 20 from which the light is reflected downward to the aperture in plate 22. This defines the first Wynne Dyson lens of the system that utilizes the five element lens system.

The second Wynne Dyson lens shown here is the same as the first such lens and performs in the same manner. In the second lens the light that passes through the aperture in plate 22 is reflected from third fold mirror 24, to the top half of second plano lens 26, proceeds through the top half of second meniscus lens 28, to the top half of second biconvex lens 50, to the top half of fourth meniscus lens 52, and is then transmitted to substantially the full surface of second concave mirror 30. From the full surface of second concave mirror 30 the light is reflected to the lower half of fourth meniscus lens 52, to the lower half of second biconvex lens 50, to the lower half of second meniscus lens 28, progresses through second plano lens 26 to fourth fold mirror 32 from which the light is reflected to substrate 34.

Additionally, the Wynne Dyson lens system of FIG. 4 includes four glass plates 54, 56, 58 and 60 through which the image passes at various points as it is processed. Small tilts on these plates can be used to adjust the alignment between the different images fields as shown in FIG. 2.

Figure 5:
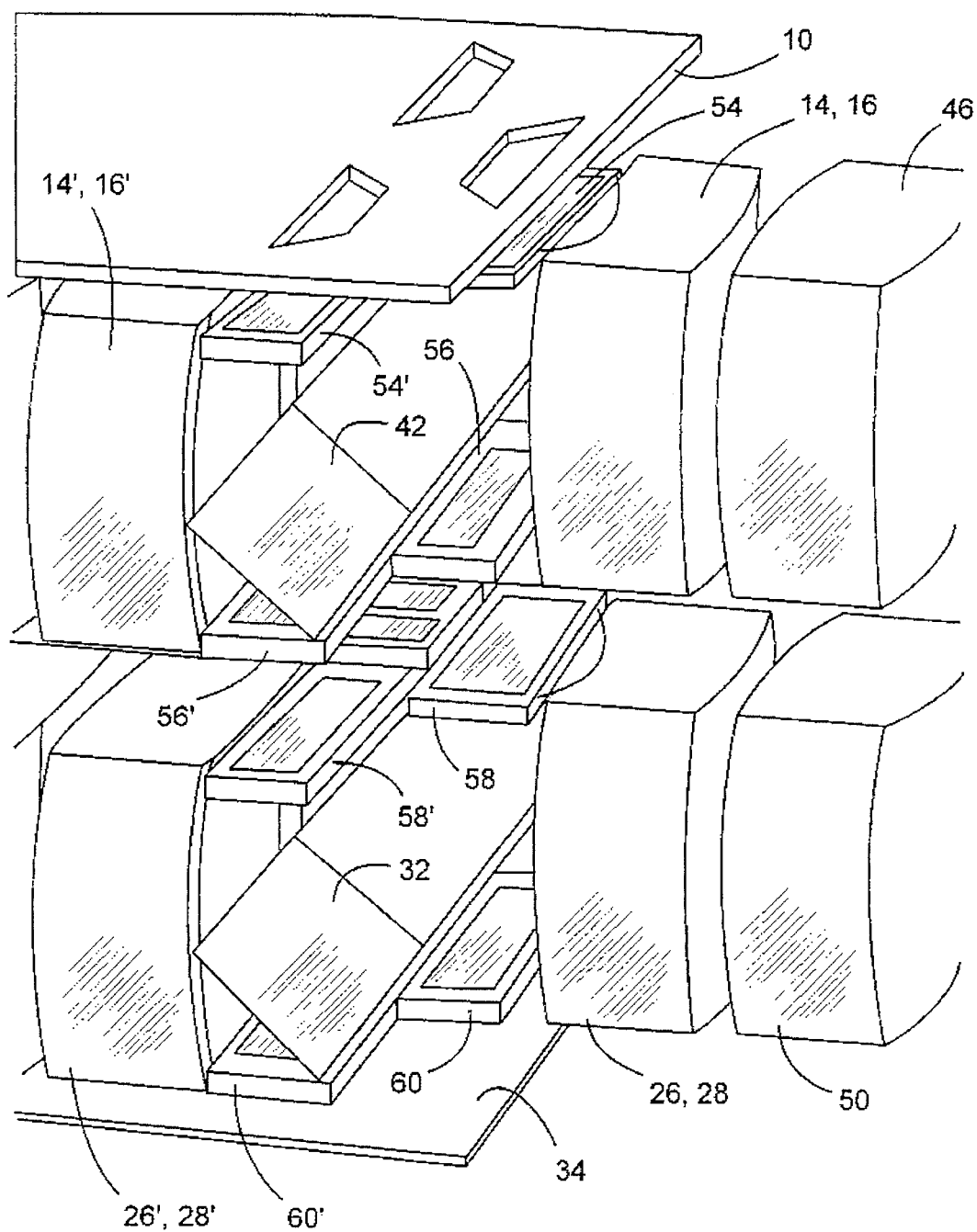
FIG. 5 is a partial perspective view of an array that utilizes the lens system of FIG. 4.

FIG. 5 shows a portion of an array of three dual Wynne Dyson lens systems each of which includes dual five lens Wynne Dyson relays of the type described in FIG. 4. Plates 54–60 are also included. Plates 54–60 can perform a variety of functions in this configuration, as well as in any other Wynne Dyson configuration. To insure the alignment of the image delivered to substrate 34 from each of the adjacent similar Wynne Dyson lens system, each of plates 54–60 could be tilted to adjust the individual image position over a small range. The intermediate focal plane provides a convenient place for a shaped aperture to insure that there is a proper overlap of the illuminated fields from each Wynne Dyson lens system. The individual plates 54–60 in any one of the dual Wynne Dyson lens system could also be selectively bent to adjust for a variation in magnification in one Wynne Dyson lens system as compared to each of the others. Similarly, some distortion correction could also be achieved by selectively twisting one or more of plates 54–60 in any of the lens systems.

Thus, with this type of array the optical axes, a line connecting corresponding points in the reticle and substrate planes, can be aligned parallel between all lens system modules of the array. Additionally, the focal planes can be made coplanar and the illumination at the extreme of one field can be truncated in such a way that the overlapping fields are not over or under exposed after scanning. Further, the array permits the alignment of individual lens system modules both by employing reasonably tight tolerances when the optical components are manufactured, as well as by the use of the fine adjustments provided for each lens system module with plates 54–60 as discussed above. Additional fine adjustment to make the focal planes of all of the lens system modules coplanar can be achieved by adjusting the axial position of mirrors 18 or 30 within each lens system module.

In the scan direction, the magnification of the overall array can be adjusted by advancing or retarding the reticle position slightly in the scan direction as scanning occurs as has been done in the Perkin Elmer Micralign 500/600 series systems.

It is also possible to use the present invention to follow an irregular substrate surface (e.g. thin film panel) by individually and dynamically focusing each array module. Focusing can be sensed with a separate air gauge sensor for each lens system module that senses the substrate position. Alternatively, a pair of sensors could be used for each module, one for the reticle and one for the substrate.

This configuration also permits the use of a wide variety of illumination systems, the most suitable of which will depend on the overall size of the array. If broad band operation is desirable, then separate (100–200 Watt) lamps could be used for each lens system module. Similarly, a single large lamp with the illumination equally divided and distributed to each lens system module could be used. Additionally, with a mercury lamp illuminated g-h system a light intensity of $\approx 0.5$ Watt/cm$^2$ is possible in a 0.1 NA system. Assuming a 250 mJ/cm$^2$ resist sensitive and a 16.2 mm wide slit a 3.24 cm/sec. scan speed is required. Such an illumination system would result in the exposure of an 8.5×11 inch panel in about 9 sec.

Advantages of the system of the present invention are that it is completely flexible and can be expanded to any desired length by merely adding additional lens system modules, staggered as shown in FIG. 3b. Thus, very high throughput is possible since only one scan in only one direction is required.

There are numerous applications for an array of this type. For example, for multichip modules, flat panels or wafer scanners that have an 8", 12", or even greater, capability. It could also be used as an electrostatic copier lens with a resolution of 1000 dots/inch that corresponds to a resolution of 25 μm and requires an NA of only 0.014 assuming an average wavelength of 5000 A°.

While the various aspects of the present invention have been described, it is contemplated that persons skilled in the art, upon reading the preceding descriptions and studying the drawings, will realize various alternative approaches to the implementation of the various aspects of the present invention. It is therefore intended that the following appended claims be interpreted as including all such alterations and modifications that fall within the spirit and scope to the present invention and the appended claims.

What is claimed is:

1. An scanning system to scan a pattern from a portion of the length of a reticle and to project said scanned pattern onto a corresponding length of a substrate, said scanning system comprising:

a first carriage to receive and transport said reticle having said pattern thereon;

a pair of Wynne Dyson lens systems in series with each other positioned to receive said pattern scanned from said reticle as said reticle is transported by said first carriage and to transmit said scanned pattern through said pair of Wynne Dyson lens systems; and a second carriage to receive said substrate to provide transport thereto with said transport being provided in synchronization with said transport of said reticle on said first carriage and positioned to receive said scanned pattern from said pair of Wynne Dyson lens systems on said substrate.

2. A scanning system as in claim 1 wherein said first and second carriages move in the same direction as each other.

3. A scanning system as in claim 1 wherein said pair of Wynne Dyson lens systems includes:

a first fold mirror positioned to receive said scanned pattern from said reticle;

a first plano lens positioned to receive in the top half thereof said scanned pattern reflected from said first fold mirror;

a first meniscus lens positioned to receive in the top half thereof said scanned pattern from said first plano lens;

a first concave mirror positioned to receive over substantially the full surface thereof said scanned pattern projected from said first meniscus lens and to reflect said scanned pattern to the lower half of said first meniscus lens;

with said scanned pattern from the lower half of said first meniscus lens being transmitted to the lower half of said first plano lens;

a second fold mirror positioned to receive said scanned pattern projected from the lower half of said first plano lens;

a third fold mirror positioned to receive said scanned pattern reflected from said second fold mirror with said scanned pattern at this point being the inverse of the original pattern scanned from said reticle;

a second plano lens positioned to receive in the top half thereof said scanned pattern reflected from said third fold mirror;

a second meniscus lens positioned to receive in the top half thereof said scanned pattern from said second plano lens;

a second concave mirror positioned to receive over substantially the full surface thereof said scanned pattern projected from said second meniscus lens and to reflect said scanned pattern to the lower half of said second meniscus lens;

with said scanned pattern from the lower half of said second meniscus lens being transmitted to the lower half of said second plano lens; and a fourth fold mirror positioned to receive said scanned pattern projected from the lower half of said second plano lens and to reflect said scanned pattern to said substrate on said second carriage with said scanned pattern received by said substrate having the same orientation as said pattern on said reticle.

4. A scanning system as in claim 3 further includes an aperture plate intermediate said second and third fold mirrors.

5. A scanning system as in claim 1 wherein said pair of Wynne Dyson lens systems includes:

a first fold mirror positioned to receive said scanned pattern from said reticle;

a first plano lens positioned to receive in the top half thereof said scanned pattern reflected from said first fold mirror;

a first meniscus lens positioned to receive in the top half thereof said scanned pattern from said first plano lens;

a first biconvex lens positioned to receive in the top half thereof said scanned pattern from said first meniscus lens;

a second meniscus lens positioned to receive in the top half thereof said scanned pattern from said first biconvex lens;

a first concave mirror positioned to receive over substantially the full surface thereof said scanned pattern projected from said second meniscus lens and to reflect said scanned pattern to the lower half of said second meniscus lens;

with said scanned pattern from the lower half of said second meniscus lens being transmitted to the lower half of said first biconvex lens, then to the lower half of said first meniscus lens from which said scanned pattern is transmitted to the lower half of said first plano lens;

a second fold mirror positioned to receive said scanned pattern from the lower half of said first plano lens;

a third fold mirror positioned to receive said scanned pattern reflected from said second fold mirror with said scanned pattern at this point being the inverse of the original pattern on said reticle;

a second plano lens positioned to receive in the top half thereof said scanned pattern reflected from said third fold mirror;

a third meniscus lens positioned to receive in the top half thereof said scanned pattern from said second plano lens;

a second biconvex lens positioned to receive in the top half thereof said scanned pattern from said third meniscus lens;

a fourth meniscus lens positioned to receive in the top half thereof said scanned pattern from said second biconvex lens;

a second concave mirror positioned to receive over substantially the full surface thereof said scanned pattern projected from said fourth meniscus lens and to reflect said scanned pattern to the lower half of said fourth meniscus lens;

with said scanned pattern from the lower half of said fourth meniscus lens being transmitted to the lower half of said second biconvex lens, then to the lower half of said third meniscus lens from which said scanned pattern is transmitted to the lower half of said second plano lens;

a fourth fold mirror positioned to receive said scanned pattern from the lower half of said second plano lens and to reflect said scanned pattern to said substrate on said second carriage with said scanned pattern received by said substrate having the same orientation as said pattern on said reticle.

6. A scanning system as in claim 5 wherein said pair of Wynne Dyson lens systems further includes an aperture plate intermediate said second and third fold mirrors.

7. A scanning system as in claim 5 wherein said pair of Wynne Dyson lens systems further includes at least one glass plate adjacent one of said first, second, third and fourth fold mirrors in the path of said scanned pattern to adjust alignment, magnification and distortion of said Wynne Dyson lens system by tilting, bending and twisting said glass plate, respectively.

8. A scanning system to scan a pattern from a portion of the length of a reticle and projecting said scanned pattern onto a corresponding length of a substrate, said scanning system comprising:

a first carriage to receive and transport said reticle having said pattern thereon;

a first pair of Wynne Dyson lens systems in series with each other positioned to receive a first portion of said scanned pattern from said reticle as said reticle is transported by said first carriage and to transmit said first portion of said scanned pattern through said first pair of Wynne Dyson lens systems;

a second pair of Wynne Dyson lens systems in series with each other positioned to receive a second portion of said scanned pattern from said reticle as said reticle is transported by said first carriage and to transmit said second portion of said scanned pattern through said second pair of Wynne Dyson lens systems; and a second carriage to receive said substrate to provide transport thereto with said transport being provided in synchronization with said transport of said reticle on said first carriage and positioned to receive said first and second portions of said scanned pattern from said first and second pair of Wynne Dyson lens systems.

9. A scanning system as in claim 8 wherein said first and second pair of Wynne Dyson lens systems are staggered one with respect to the other so that said first and second portions of said scanned pattern are juxtaposed on said substrate when said scanning and transmission is completed.

10. A scanning system as in claim 8 wherein:

said first pair of Wynne Dyson lens systems includes:
a first fold mirror positioned to receive said first portion of said scanned pattern from said reticle;

a first Wynne Dyson lens positioned to receive in the top half thereof said first portion of said scanned pattern from said first fold mirror and to transmit said first portion of said scanned pattern through said first Wynne Dyson lens to the bottom thereof;

a second fold mirror positioned to receive said first portion of said scanned pattern from the bottom half of said first Wynne Dyson lens;

a third fold mirror positioned to receive said first portion of said scanned pattern reflected from said second fold mirror with said first portion of said scanned pattern at this point being the inverse of the original first portion of the pattern scanned from said reticle;

a second Wynne Dyson lens positioned to receive in the top half thereof said first portion of said scanned pattern from said third fold mirror and to transmit said first portion of said scanned pattern through said second Wynne Dyson lens to the bottom thereof; and a fourth fold mirror positioned to receive said first portion of said scanned pattern from the bottom half of said second Wynne Dyson lens; and said second pair of Wynne Dyson lens systems includes:
a fifth fold mirror positioned to receive said second portion of said scanned pattern from said reticle;

a third Wynne Dyson lens positioned to receive in the top half thereof said second portion of said scanned pattern from said fifth fold mirror and to transmit said second portion of said scanned pattern through said third Wynne Dyson lens to the bottom thereof;

a sixth fold mirror positioned to receive said second portion of said scanned pattern from the bottom half of said third Wynne Dyson lens;

a seventh fold mirror positioned to receive said second portion of said scanned pattern reflected from said sixth fold mirror with said second portion of said scanned pattern at this point being the inverse of the original second portion of the pattern scanned from said reticle;

a fourth Wynne Dyson lens positioned to receive in the top half thereof said second portion of said scanned pattern from said seventh fold mirror and to transmit said second portion of said scanned pattern through said fourth Wynne Dyson lens to the bottom thereof; and an eighth fold mirror positioned to receive said second portion of said scanned pattern from the bottom half of said fourth Wynne Dyson lens;

with said first and second pairs of Wynne Dyson lens systems being oriented away from each other, and said first and fifth, and third and seventh, fold mirrors reflecting said first and second portions of said scanned pattern, respectively, in opposite directions.

11. A scanning system as in claim 10 wherein:

each of said first and second pairs of Wynne Dyson lens systems each define a centerline therethrough;

each of said first and second pairs of Wynne Dyson lens systems each defining a field of view of a selected length; and the centerlines of said first pair of Wynne Dyson lens systems is off-set from the centerlines of said second pair of Wynne Dyson lens systems by the average of the selected lengths of the fields of view of said first and second pairs of Wynne Dyson lens systems.

12. A scanning system as in claim 8 wherein:

said scanning system further includes:
  a third pair of Wynne Dyson lens systems in series with each other positioned to receive a third portion of said scanned pattern from said reticle as said reticle is transported by said first carriage and to transmit said third portion of said pattern through said third pair of Wynne Dyson lens systems;

with said second carriage further positioned to receive said third portion of said scanned pattern from said third pair of Wynne Dyson lens systems; and with said third pair of Wynne Dyson lens systems off-set from said first and second pair of Wynne Dyson lens systems, one with respect to the other, so that said first, second and third portions of said scanned pattern are serially juxtaposed on said substrate when said scanning and transmission is completed.

13. A scanning system as in claim 12 wherein:

each of said first, second and third pairs of Wynne Dyson lens systems each define a centerline therethrough;

each of said first, second and third pairs of Wynne Dyson lens systems each defining a field of view of a selected length;

the centerlines of said first pair of Wynne Dyson lens systems is off-set from the centerlines of said second pair of Wynne Dyson lens systems by the average of the selected lengths of the fields of view of said first and second pairs of Wynne Dyson lens systems; and the centerlines of said second pair of Wynne Dyson lens systems is off-set from the centerlines of said third pair of Wynne Dyson lens systems by the average of the selected lengths of the fields of view of said second and third pairs of Wynne Dyson lens systems.

14. A scanning system as in claim 12 wherein:

said first pair of Wynne Dyson lens systems includes:
  a first region of a first fold mirror positioned to receive said first portion of said scanned pattern from said reticle;
  a first Wynne Dyson lens positioned to receive in the top half thereof said first portion of said scanned pattern from said first region of said first fold mirror and to transmit said first portion of said scanned pattern through said first Wynne Dyson lens to the bottom thereof;
  a first region of a second fold mirror positioned to receive said first portion of said scanned pattern from the bottom half of said first Wynne Dyson lens;
  a first region of a third fold mirror positioned to receive said first portion of said scanned pattern reflected from said first region of said second fold mirror with said first portion of said scanned pattern at this point being the inverse of the original first portion of the pattern scanned from said reticle;
  a second Wynne Dyson lens positioned to receive in the top half thereof said first portion of said scanned pattern from said first region of said third fold mirror and to transmit said first portion of said scanned pattern through said second Wynne Dyson lens to the bottom thereof; and
  a first region of a fourth fold mirror positioned to receive said first portion of said scanned pattern from the bottom half of said second Wynne Dyson lens;

said second pair of Wynne Dyson lens systems includes:
  a fifth fold mirror positioned to receive said second portion of said scanned pattern from said reticle;
  a third Wynne Dyson lens positioned to receive in the top half thereof said second portion of said scanned pattern from said fifth fold mirror and to transmit said second portion of said scanned pattern through said third Wynne Dyson lens to the bottom thereof;
  a sixth fold mirror positioned to receive said second portion of said scanned pattern from the bottom half of said third Wynne Dyson lens;
  a seventh fold mirror positioned to receive said second portion of said scanned pattern reflected from said sixth fold mirror with said second portion of said scanned pattern at this point being the inverse of the original second portion of the pattern scanned from said reticle;
  a fourth Wynne Dyson lens positioned to receive in the top half thereof said second portion of said scanned pattern from said seventh fold mirror and to transmit said second portion of said scanned pattern through said fourth Wynne Dyson lens to the bottom thereof; and
  an eighth fold mirror positioned to receive said second portion of said scanned pattern from the bottom half of said fourth Wynne Dyson lens; and said third pair of Wynne Dyson lens systems:
  utilizes a second region of said first fold mirror positioned to receive said third portion of said scanned pattern from said reticle;
  includes a fifth Wynne Dyson lens positioned to receive in the top half thereof said third portion of said scanned pattern from said second region of said first fold mirror and to transmit said third portion of said scanned pattern through said fifth Wynne Dyson lens to the bottom thereof;
  utilizes a second region of said second fold mirror positioned to receive said third portion of said scanned pattern from the bottom half of said fifth Wynne Dyson lens;
  utilizes a second region of said third fold mirror positioned to receive said third portion of said scanned pattern reflected from said second region of said second fold mirror with said third portion of said scanned pattern at this point being the inverse of the original third portion of the pattern scanned from said reticle;

includes a sixth Wynne Dyson lens positioned to receive in the top half thereof said third portion of said scanned pattern from said second region of said third fold mirror and to transmit said third portion of said scanned pattern through said sixth Wynne Dyson lens to the bottom thereof; and utilizes a second region of said fourth fold mirror positioned to receive said third portion of said scanned pattern from the bottom half of said sixth Wynne Dyson lens;

with said first and second pairs of Wynne Dyson lens systems being oriented away from each other, and said first and fifth, and third and seventh, fold mirrors reflecting said first and second portions of said scanned pattern, respectively, in opposite directions; and with said first and third pairs of Wynne Dyson lens systems being oriented in the same direction, and said first and second regions of said first, second, third and fourth fold mirrors reflecting said first and third portions of said scanned pattern, respectively, in the direction each offset from the other.

15. A scanning system to scan a pattern from a portion of the length of a reticle and to project said scanned pattern onto a corresponding length of a substrate, said scanning system comprising:

a first carriage to receive and transport said reticle having said pattern thereon;

a first plurality of lens systems adjacent each other and oriented in the same direction as each other side by side with each lens system including a first and a second Wynne Dyson lens system in series with each other;

a second plurality of lens systems adjacent each other and oriented in the same direction as each other side by side with each lens system including a first and a second Wynne Dyson lens system in series with each other;

a first fold mirror system positioned to receive said scanned pattern from said reticle and to reflect a different portion of said scanned pattern from different locations on said first fold mirror system to said first Wynne Dyson lens array of each of said first and second plurality of lens systems;

a second fold mirror system positioned to receive said different portions of said scanned pattern at different locations on said second fold mirror system after said different portions of said scanned pattern have passed through each of said first Wynne Dyson lens array of each of said first and second plurality of lens systems;

a third fold mirror system positioned to receive said different portions of said scanned pattern at different locations on said third fold mirror system from different locations on said second fold mirror system and to reflect a different portion of said scanned pattern from different locations on said third fold mirror system to said second Wynne Dyson lens array of each of said first and second plurality of lens systems;

a fourth fold mirror system positioned to receive said different portions of said scanned pattern at different locations on said fourth fold mirror system after said different portions of said scanned pattern have passed through each of said second Wynne Dyson lens array of each of said first and second plurality of lens systems; and a second carriage to receive said substrate to provide motion thereto with said motion being provided in synchronization with said transport of said reticle on said first carriage and positioned to receive said different portions of said scanned pattern from said pair of Wynne Dyson lens systems at different locations on said substrate.

16. A scanning system as in claim 15 wherein said different scanned pattern portions are adjacent each other when projected to said substrate.

17. A scanning system as in claim 15 wherein said different scanned pattern portions are projected to said substrate alternately from said first and second plurality of lens systems.

* * * * *